United States Patent [19]

Stopper

[11] Patent Number: 4,460,224
[45] Date of Patent: Jul. 17, 1984

[54] FOLDABLE CIRCUIT ASSEMBLY

[75] Inventor: Herbert Stopper, Orchard Lake, Mich.

[73] Assignee: Burroughs Corporation, Detroit, Mich.

[21] Appl. No.: 380,582

[22] Filed: May 21, 1982

[51] Int. Cl.³ .............................................. H01R 23/68
[52] U.S. Cl. .................................................... 339/17 F
[58] Field of Search ................. 339/17 R, 17 E, 17 F; 361/398, 401

[56] References Cited

U.S. PATENT DOCUMENTS

| | | | |
|---|---|---|---|
| 3,242,384 | 3/1966 | Klehm, Jr. | 361/398 |
| 3,755,717 | 8/1973 | Shaw | 361/398 |
| 3,971,127 | 7/1976 | Giguere et al. | 361/398 |
| 3,984,739 | 10/1976 | Mochizuki et al. | 361/401 |

FOREIGN PATENT DOCUMENTS 1766162 10/1969 Fed. Rep. of Germany ...... 361/398

OTHER PUBLICATIONS

IBM Bulletin, Thorpe et al., vol. 13, No. 10, p. 3708, 5-1971.
Electronics, Microminiaturization, 11-1960, pp. 78-80.
Electronic Design, 3M Advertisement, 8-1962, p. 132.

*Primary Examiner*—Neil Abrams
*Attorney, Agent, or Firm*—Thomas W. Baumgarten, Jr.; Kevin R. Peterson; David Rasmussen

[57] ABSTRACT

Disclosed is a foldable circuit assembly 10 which has eight support members 11 having windows 12 in which circuits are bonded. The support members are all interconnected by a flexible polyimide web and an electrical circuit is etched thereon so as to interconnect the circuits and the external world via a contact tab extending from one of the support wafer members 11.

1 Claim, 2 Drawing Figures

FOLDABLE CIRCUIT ASSEMBLY

BACKGROUND OF THE INVENTION

This invention relates to an interconnection apparatus for mounting a plurality of semiconductor wafers.

In the prior art there are numerous devices for packaging semiconductor wafers. The usual practice is to mount the wafers as discrete dies in a ceramic package. For instance IBM has recently announced use of a 64 chip package with a plurality of chips mounted in a single package, with gold solder connecting the chips to pins of the package, and the package pins being used to plug the package into the printed circuit board.

While ceramic chips are generally preferred, plastic packages are also commonly used for chips.

These plastic packages have often been made of polyimides. Polyimides have also been used in the manufacture of flexible cable circuits.

Illustrative of the prior art is a number of patents having to do with a flexible circuit assembly, wherein Tommy L. Walton is the inventor. Many of the manufacturing techniques relating to the present invention are disclosed in such patents as U.S. Pat. No. 4,092,057, issued May 30, 1978; U.S. Pat. No. 4,026,011 and U.S. Pat. No. 4,075,420 issued Feb. 21, 1978.

SUMMARY OF THE INVENTION

This invention specifically improves over these prior art techniques by providing a foldable assembly for a plurality of circuits in which there is provided a plurality of support members for circuits places and bonded in windows of the support members, and wherein the support members are interconnected by a flexible web, one of the support members having a contact pad extending therefrom so that the circuits in the window of one of the support windows can be connected by a circuit etched on the apparatus to a circuit of the other support members and to the external world via a contact pad. The folded circuit assembly of the preferred embodiment of my invention is formed by folding the support members to place one on top of the other which each is still electrically interconnected to the other and to the contact pad extending from the assembly.

Without departing from my invention as defined in the accompanying claims, one skilled in the art may modify my invention which is described more fully in the following drawings and description following the outline of the particular drawings.

DETAILED DESCRIPTION OF THE DRAWINGS

The following description will refer to the appended drawings, in which

Figure 1:
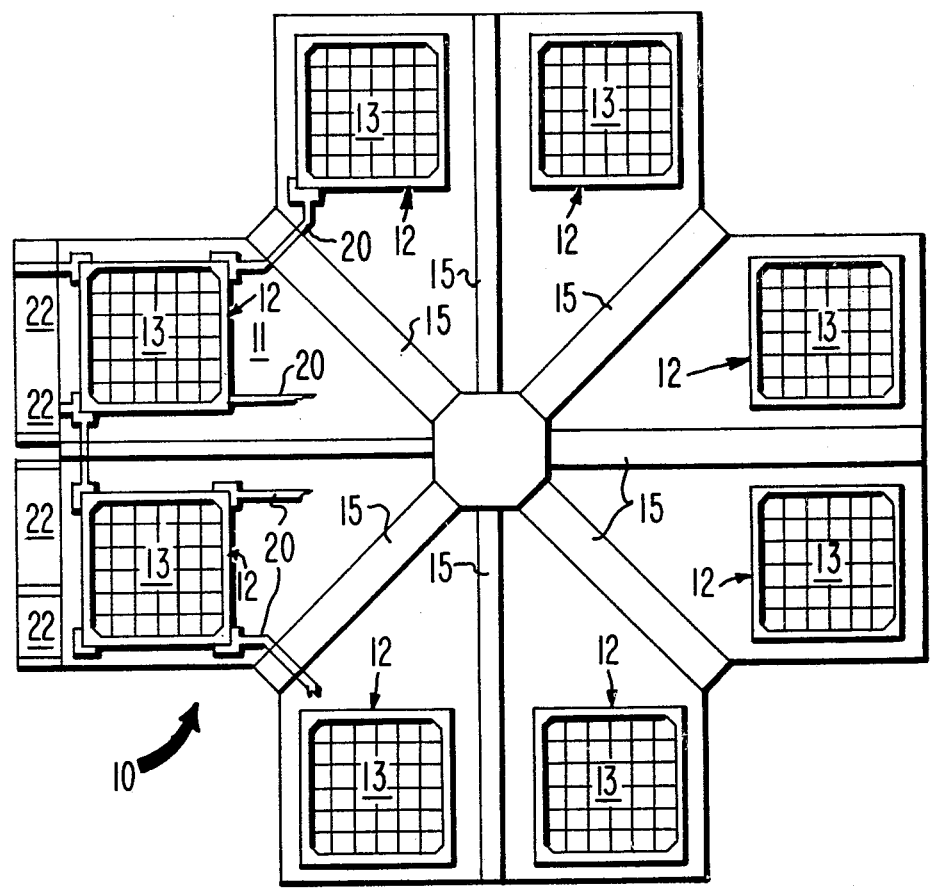
FIG. 1 is a plan view of the foldable circuit assembly in accordance with the preferred embodiment of my invention.

Referring to the foregoing drawings in greater detail, eight substantially flat support members are arranged as shown interconnected by a flexible membrane. Each of the support members 11 have a rectangular window 12 for support of a wafer 13 which is mounted therein.

The flat support members 11 are quadrilaterals having angles of 90° at the outer ends and edges of the foldable circuit assembly 10. At the center of the foldable circuit assembly 10 each of the support members come to a point as shown and have an accute angle there of approximately 45°. The other internal angle of the quadrilateral support members 11 is approximately 135°.

In the preferred embodiment, each support member is approximately 62 mils thick between the outer and inner surfaces. These support members 11 serve as an insulating substrate and can be made of typical circuit board materials such as glass fiber base epoxy, paper base phenolic, or random glass fiber polyester. This group of materials includes NEMA (National Electronics Manufacturers Association) XXXP; XXXPC; FR 2, 3,4 and 5; G10 and G11; and FR-6. As will become evident later in this description, the material for support members 11 is chosen to be that desired for the rigid connectors to the circuit assembly.

The support members 11 are interconnected by a flexible web 15. This flexible web is laminated to the rigid support members during the course of manufacture of the foldable circuit assembly 10. This flexible web is made of thermosetting polyimide, such as that sold by E. I. du Pont de Nemours and Company, Inc. under the trademark KAPTON. The circuit assembly web is made as a flexible sheet laminate approximately three mils in thickness by compression molding at 425° F., 3000 p.s.i. in 2–10 minute cycles, or alternatively by free sintering with the support substrate 11 at 480° F. for 15–30 seconds at 15,000 p.s.i. cold forming.

Interconnection leads are made on the foldable circuit assembly 10 by electroplating on the outer surface of the insulating material. This insulating material, we have preferably stated is a polyimide. Other materials which may be used for insulating film include polyvinyl chloride, polytetraflouroethylene, and the like. On the outer surfaces of the insulating material is a layer of metal, preferably copper. In this preferred embodiment, copper layers are evenly distributed on the finished insulating material.

These copper layers can be plated directly on the insulating material or a metallic clad insulating film may be bonded thereto which already bears the metal on the surface. Such a preferred film is that distributed by Fortin Laminating Corporation of San Fernando, Calif., U.S.A. under the trade name "Poly-Core EPO31C03". This may be laminated to the assembly 10 by laminating the layers together in a heated hydraulic press at 340° F. at a pressure of 50–500 p.s.i. for 45–60 minutes.

The next step in manufacture is to etch the metal layer to form the desired spaced conductors 20. Portions of a tab 22 of the support members which is used as a contact tab 22 for connection to the socket 30 are also etched at the same time. One or more of the support members may have a contact tab, and the configuration of the conductors 20 and number of tabs 22 is a matter of individual designer preference.

The copper layer can be etched using known photolithographic techniques known in flexible circuit technology. Briefly, this is accomplished by applying a photoresist to copper layered support members 11 and exposing a desired circuit pattern using opaque masks, and then developing the resist. The developed photo resist is then washed away leaving selected portions of the copper layer exposed in the desired circuit pattern. A thin layer of tin and lead alloy is then electroplated onto the exposed copper. The remaining photoresist is then stripped away. Then the portions of the copper layer which are not covered by the tin and lead alloy are then etched away using a suitable etchant such as ammonium persulfate.

Figure 2:
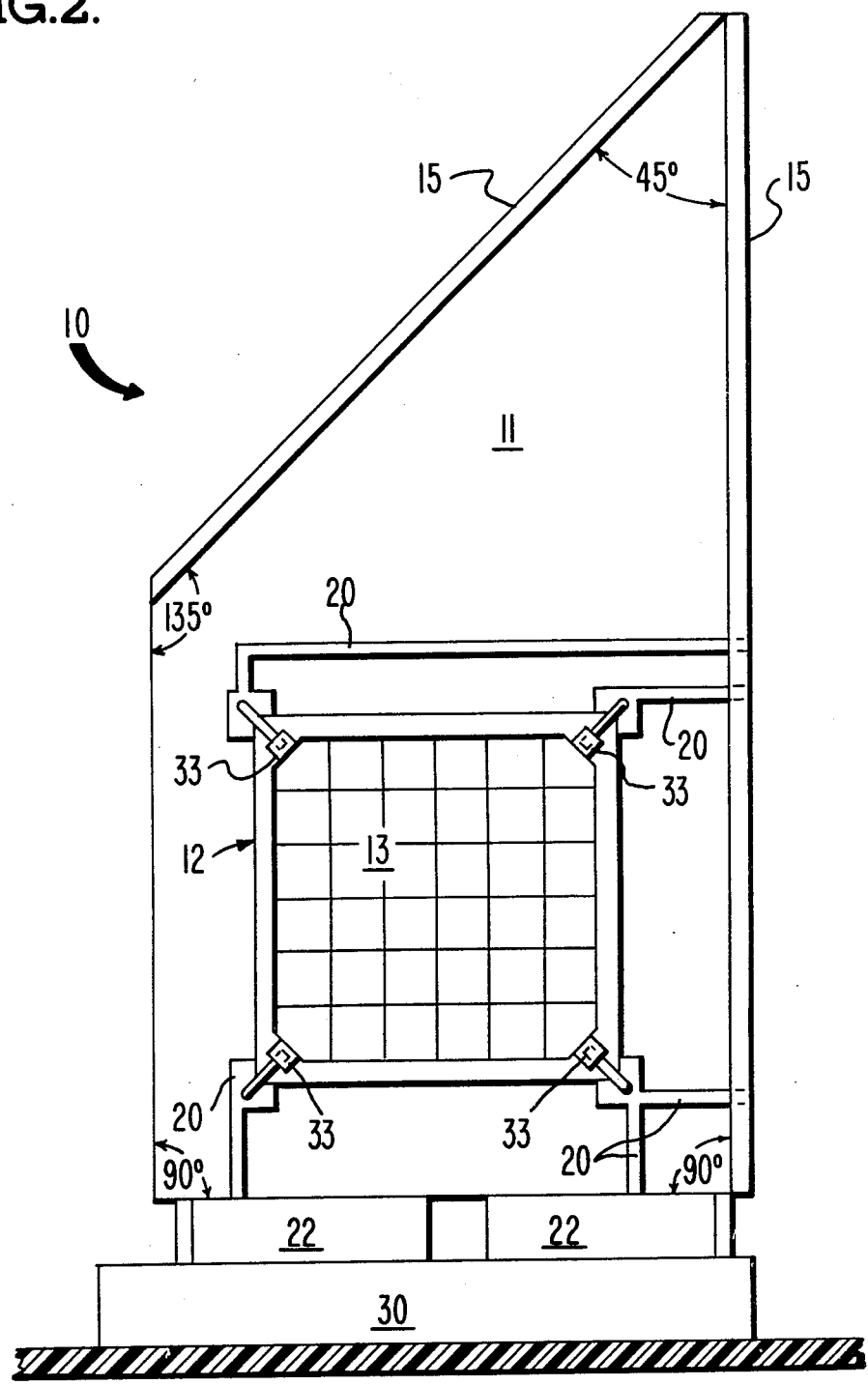
FIG. 2, is a view of the folded circuit assembly of FIG. 1, illustrating the connection of the assembly to a board interconnect device.

The contact pads terminate at the selected outer edges of the support members 11. After insertion and bonding of the wafer in the windows 12, the circuit assembly is folded to the configuration shown in FIG. 2 and inserted in the contact socket.

The wafers which are inserted in the windows have a plurality of pads, usually two to four, for both serial signal entry and power. These pads 33 are bonded with gold to the conductors which have been etched on the support members. They are first placed in the windows and bonded in place with epoxy adhesive. Then the bonds to the support member circuit are made.

I claim:

1. A foldable assembly for a plurality of integrated circuits comprising:

eight rigid support members shaped as quadrilaterals with two ninety degree internal angles, a forty-five degree internal angle and a one hundred thirty-five degree internal angle;

means for flexibly joining the support members in a substantially circular configuration along the sides of the quadrilateral defining the forty-five degree internal angle such that each support member is joined directly to two other support members;

means for attaching the plurality of integrated circuits to the support members;

means for electrically interconnecting the integrated circuits; and means for providing electrical communication to the foldable assembly;

said support members being capable of being folded together such that the integrated circuits lie in substantially parallel planes.

* * * * *